(12) United States Patent
Shiomi

(10) Patent No.: US 6,272,058 B1
(45) Date of Patent: Aug. 7, 2001

(54) SEMICONDUCTOR MEMORY DEVICE CAPABLE OF PERFORMING DATA READING/WRITING IN UNITS OF PLURALITY OF BITS

(75) Inventor: Toru Shiomi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/645,501

(22) Filed: Aug. 25, 2000

(30) Foreign Application Priority Data

Mar. 1, 2000 (JP) .................................................. 12-055638

(51) Int. Cl.[7] ...................................................... G11C 7/00
(52) U.S. Cl. ............................................... 365/200; 365/49
(58) Field of Search ........................ 365/200, 49, 189.07

(56) References Cited

U.S. PATENT DOCUMENTS

| | | | |
|---|---|---|---|
| 5,278,839 | * 1/1994 | Matsumoto et al. ................. | 371/21.2 |
| 5,355,339 | * 10/1994 | Oh et al. ............................... | 365/200 |
| 5,841,961 | 11/1998 | Kozaru et al. ........................ | 365/200 |
| 5,995,422 | * 11/1999 | Im et al. ............................... | 365/200 |
| 6,094,382 | * 7/2000 | Choi et al. ........................... | 365/200 |

FOREIGN PATENT DOCUMENTS 8-31195   2/1996   (JP) .

* cited by examiner

*Primary Examiner*—Son T. Dinh
(74) *Attorney, Agent, or Firm*—McDermott, Will & Emery

(57) ABSTRACT

In a cache memory, when column address signals designating a defective column of a tag memory are input, a control circuit may inactivate the tag memory and control a switch circuit so that a spare data input/output terminal of a data memory is coupled to a data bus between the tag memory and a logic circuit. Compared to the conventional case in which a defective column of the tag memory is only replaceable by a spare column within the same tag memory, the degree of freedom in redundancy, and also the yield increase.

4 Claims, 12 Drawing Sheets

SEMICONDUCTOR MEMORY DEVICE CAPABLE OF PERFORMING DATA READING/WRITING IN UNITS OF PLURALITY OF BITS

BACKGROUND OF THE INVENTION

1. Field of the Invention

The present invention relates to semiconductor memory devices, and more particularly, to a semiconductor memory device that is capable of reading/writing data in units of a plurality of bits.

2. Description of the Background Art

A method for reducing an access time is conventionally known in which a cache memory is placed between a central processing unit (CPU) and a main memory device to copy and store therein a portion of data stored in the main memory device that is frequently accessed.

FIG. 12 is a block diagram showing a configuration of such cache memory. Referring to FIG. 12, the cache memory includes a tag memory 71, a data memory 72, a logic circuit 73 and a control circuit 74.

At each address of tag memory 71, tag data of a plurality of bits (herein, represented by one bit for simplification of the drawing and description) is stored. At each address of data memory 72, data of a plurality of bits (herein, represented by 2 bits for simplification of the drawing and description) is stored.

Tag memory 71 is provided with an SRAM 71a as shown in FIG. 13. SRAM 71a includes a memory array 80, a redundant memory array 81, a bit line peripheral circuit 82, a row decoder 83, a column decoder 84, a redundant column decoder 85 and a read/write circuit 86.

Memory array 80 includes memory cells MC arranged in rows and columns, word lines WL provided corresponding to respective rows, and bit line pairs BLP provided corresponding to respective columns. Redundant memory array 81 has a configuration identical to that of memory array 80, except that it has fewer columns. Word lines WL are commonly provided for memory array 80 and redundant memory array 81.

Bit line peripheral circuit 82 performs precharging and equalization of each bit line pair BLP. Row decoder 83 selects one of the plurality of word lines WL according to row address signals RA0–RAn (n is an integer at least 0) and drives the word line WL to an H level corresponding to a selected level.

Column decoder 84 is activated when a signal /φH1 is at an "H" level, and selects one of the plurality of bit line pairs BLP included in memory array 80 according to column address signals CA0–CAn.

Redundant column decoder 85 is activated when a signal φH1 is at an "H" level, and selects one of the plurality of bit line pairs BLP included in redundant memory array 81 according to column address signals CA0–CAn. Either one of column decoder 84 and redundant column decoder 85 is activated at one time.

Read/write circuit 86 performs reading/writing of data of memory cells MC connected to word line WL selected by row decoder 83 through bit line pair BLP selected by column decoder 84 or redundant column decoder 85. Read/write circuit 86 is coupled to a logic circuit 73 via a data input/output terminal DQ1 and a data bus DB1.

Data memory 72 includes two SRAMs as shown in FIG. 13. Column decoders 84, 84 of these two SRAMs are activated when signals /φH2, /φH3 are at an H level, respectively. Redundant column decoders 85, 85 are activated when signals φH2, φH3 are at an H level, respectively. Read/write circuits 86, 86 of the two SRAMs are coupled to logic circuit 73 through data input/output terminals DQ2, DQ3 and data buses DB2, DB3, respectively.

Logic circuit 73 receives data DATA from data memory 22 and outputs the data as it is to the outside. It compares tag data received from tag memory 71 with tag data ATD externally supplied, and, when the two tag data match with each other, outputs a signal HIT indicating that the output data DATA is valid, and, when the two tag data mismatch, outputs a signal MISS indicating that the output data is invalid.

Control circuit 74 includes a plurality of program circuits for programming column address signals CA0–CAn for designation of defective columns in memories 71, 72. Control circuit 74 responds to column address signals CA0–CAn and outputs signals φH1, /φH1, φH2, /φH2, φH3 and /φH3.

Hereinafter, the operation of the cache memory will be described. When address signals RA0–RAn, CA0–CAn and tag data ATD are externally supplied, signals φH1 and /φH1 and signals φH2, /φH2, φH3 and /φH3 are supplied from control circuit 74 to tag memory 1 and to data memory 72, respectively. Tag data in tag memory 71 and data in data memory 72 are then read out.

The tag data read out from tag memory 71 is compared with externally supplied tag data ATD at logic circuit 73. Signal HIT is output when they match, and signal MISS is output when they mismatch. The data DATA read out from data memory 72 is output as it is via logic circuit 73 to the outside.

The conventional cache memory with such configuration as described above is only able to replace the defective column in tag memory 71 with a spare column in tag memory 71. It is unable to replace the defective column in tag memory 71 with a spare column in data memory 72. Likewise, the defective column in data memory 72 is only replaceable with a spare column in data memory 72, not with a spare column in tag memory 71. Thus, the degree of freedom in redundancy is low, and the yield is poor.

SUMMARY OF THE INVENTION

Therefore, a main object of the present invention is to provide a semiconductor memory device having a high degree of freedom in redundancy.

The semiconductor memory device according to the present invention includes: first to Nth read/write circuits and first to Nth data input/output terminals for performing reading/writing of data of first to Nth memory arrays; an Nth plus one read/write circuit for performing reading/writing of data of a spare memory cell; a control circuit for storing an address signal of a defective memory cell and a number i of a memory array to which the memory cell belongs, and for inactivating the i-th read/write circuit in response to an input of the address signal stored; and a switching circuit for coupling the N plus one read/write circuit with the i-th data input/output terminal in response to the inactivation of the i-th read/write circuit. With such a configuration, it becomes possible to replace a defective memory cell in any of the first to Nth memory arrays with a spare memory cell. Thus, the degree of freedom in redundancy and also the yield increase, compared to the conventional case in which only a defective memory cell in a predetermined memory array was replaceable with a spare memory cell.

Preferably, a plurality of sets of the spare memory cell, the Nth plus one read/write circuit, the control circuit and the switching circuit are provided, and a plurality of sets of the spare memory cell and the Nth plus one read/write circuit are distributed in the vicinity of the first to Nth memory arrays. In this case, flexibility for chip layout increases.

More preferably, a plurality of sets of the spare memory cell, the Nth plus one read/write circuit, the control circuit and the switching circuit are provided, and a plurality of sets of the spare memory cell and the Nth plus one read/write circuit are collectively placed in a predetermined region. In this case, the spare memory cells and the others are placed together in a spare space on the chip, and thus, effective area use is guaranteed.

More preferably, the semiconductor memory device is a cache memory, in which the first to Mth memory arrays constitute a tag memory, and the Mth plus one to the Nth memory arrays constitute a data memory. The cache memory further includes a logic circuit that outputs a signal indicating validity of read data in response to matching between tag data output from the first to Mth data input/output terminals and externally supplied tag data. The present invention is most effective in this case.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
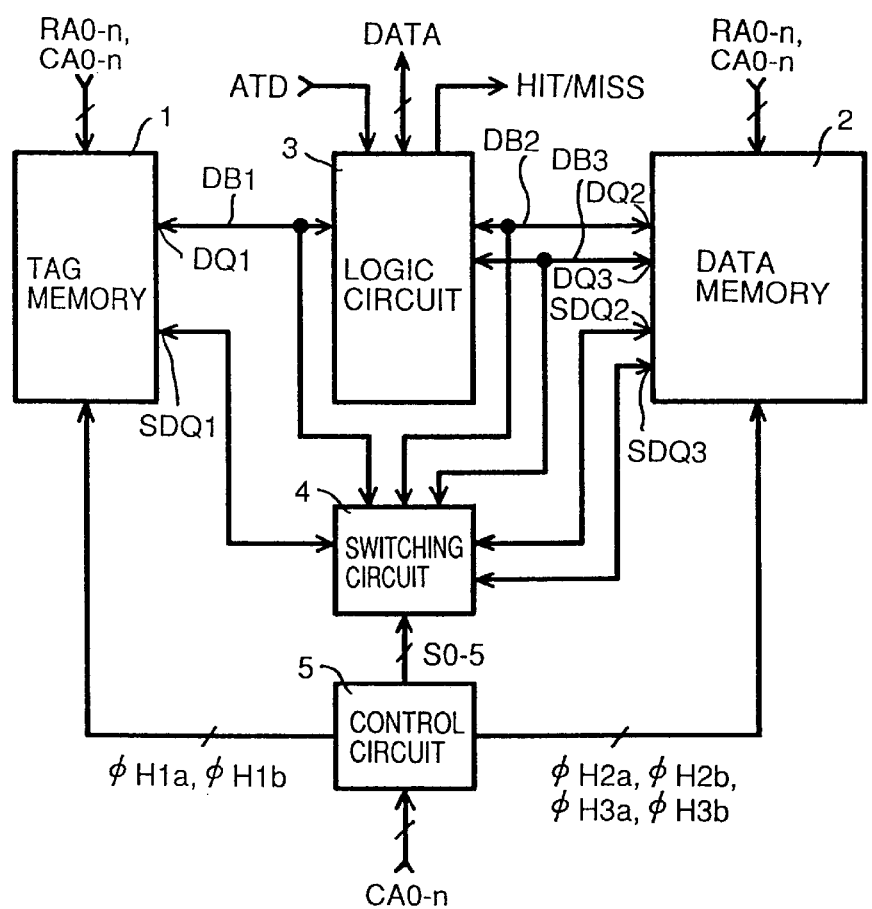
FIG. 1 is a block diagram showing a configuration of a cache memory according to an embodiment of the present invention.

Referring to FIG. 1, a cache memory according to an embodiment of the present invention includes a tag memory 1, a data memory 2, a logic circuit 3, a switching circuit 4 and a control circuit 5.

Tag memory 1 is a memory for performing writing/reading of tag data of a plurality of bits (herein, represented by one bit for simplification of the drawing and description). If necessary, it also performs writing/reading of data that should be performed by data memory 2. Specifically, tag memory 1 performs reading/writing of data at an address designated by row address signals RA0–RAn and column address signals CA0–CAn. Input/output of data to/from tag memory 1 is performed (a) via a data input/output terminal DQ1 if signal H1$a$ is at an H level corresponding to an activated level; (b) via a spare data input/output terminal SDQ1 if signal H1$b$ is an H level of the activated level; or (c) via data input/output terminals DQ1 and SDQ1 if both signals H1$a$ and H1$b$ are at an H level of the activated level. Data input/output terminal DQ1 is connected via data bus DB1 to logic circuit 3 and switching circuit 4. Spare data input/output terminal SDQ1 is connected to switching circuit 4.

Figure 2:
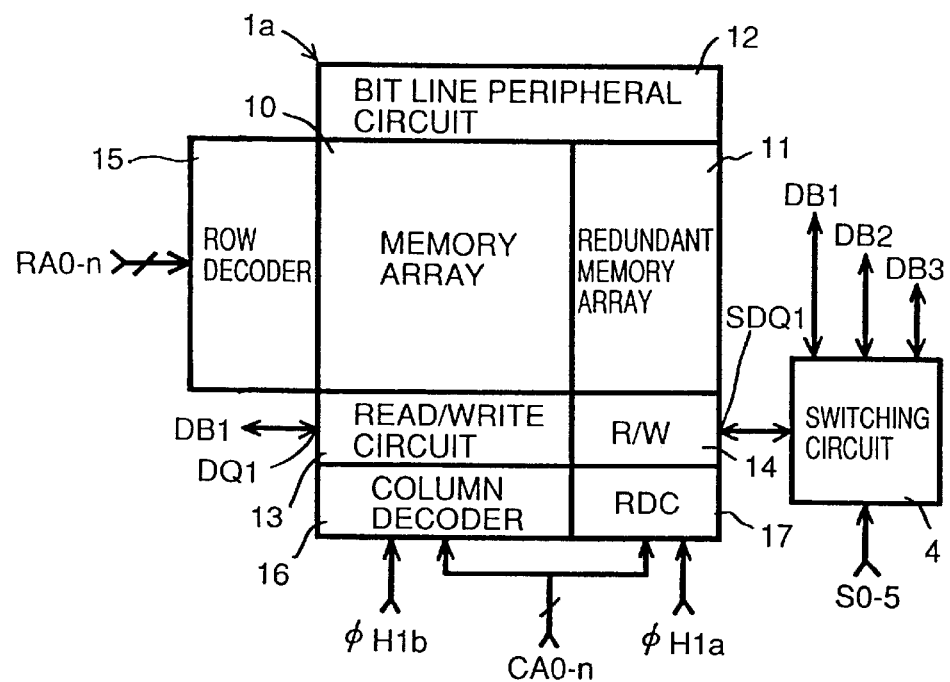
FIG. 2 is a block diagram showing a configuration of an SRAM included in a tag memory shown in FIG. 1.

More specifically, tag memory 1 is provided with an SRAM 1$a$ as shown in FIG. 2. SRAM 1$a$ includes a memory array 10, a redundant memory array 11, a bit line peripheral circuit 12, read/write circuits 13, 14, a row decoder 15, a column decoder 16 and a redundant column decoder 17.

Figure 3:
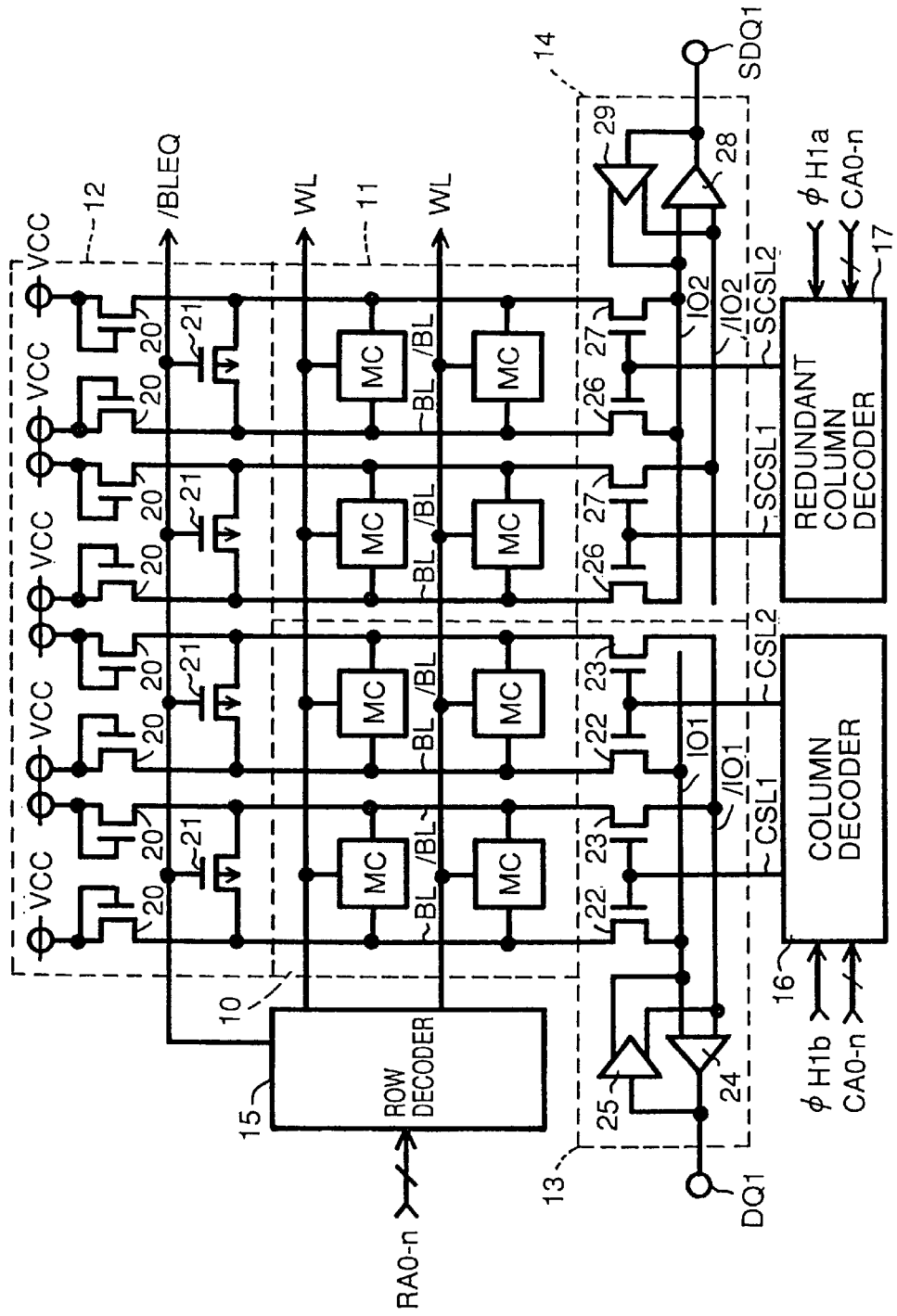
FIG. 3 is a circuit block diagram showing the configuration of the SRAM shown in FIG. 2.

Memory array 10 includes, as shown in FIG. 3, a plurality of memory cells MC arranged in rows and columns (herein, only those in two rows and two columns are shown representatively for simplification of the drawing and description), word lines WL provided corresponding to respective rows, and bit line pairs BL, /BL provided corresponding to respective columns.

Figure 4A:
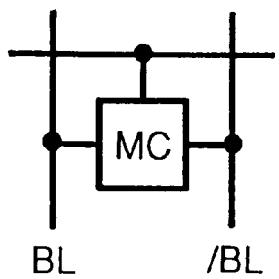
FIGS. 4A and 4B are circuit diagrams showing a configuration of a memory cell shown in FIG. 3.
Figure 4B:
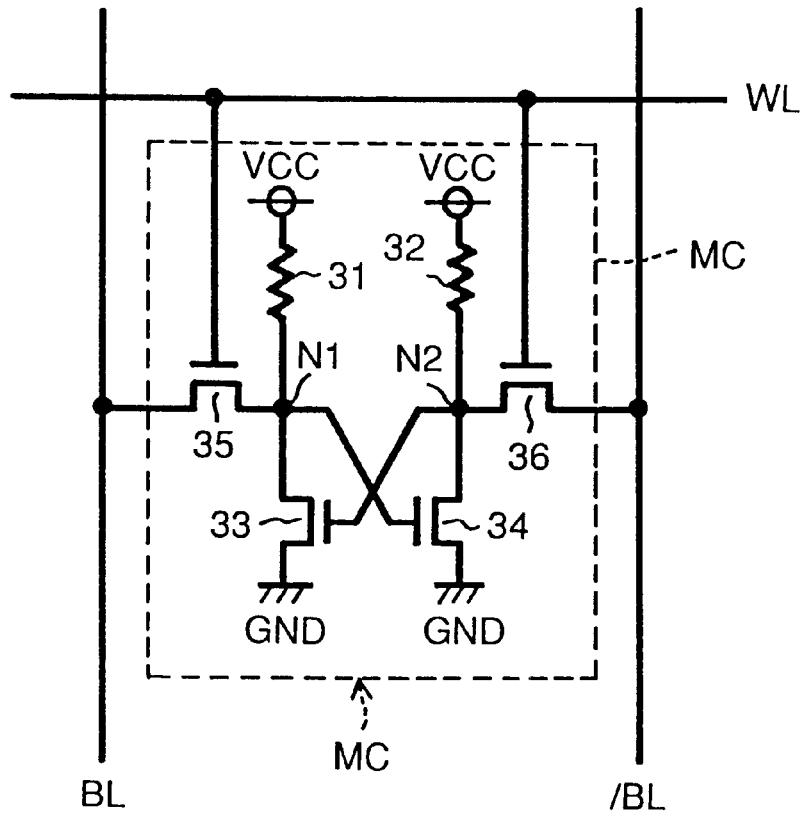

Memory cell MC includes, as shown in FIGS. 4A and 4B, resistors 31, 32, driver transistors (N channel MOS transistors) 33, 34, access transistors (N channel MOS transistors) 35, 36, and memory nodes N1, N2. Resistors 31, 32 are connected between lines of power supply potential VCC and memory nodes N1, N2, respectively. Driver transistors 33, 34 are connected between memory nodes N1, N2 and lines of ground potential GND, respectively, with their gates connected to memory nodes N2, N1, respectively. Access transistors 35, 36 are connected between memory nodes N1, N2 and corresponding bit lines BL, /BL, respectively, with their gates commonly connected to corresponding word line WL.

In a writing operation, word line WL is driven to an H level of the selected level, and bit lines BL and /BL are driven to an H level and an L level, respectively, for example, according to the write data. In response, transistors 34–36 are rendered conductive, transistor 33 non-conductive, and memory nodes N1, N2 attain an H level and an L level, respectively. When word line WL is driven to an L level corresponding to a non-selected level, the levels of memory nodes N1, N2 are retained by currents flowing in resistors 31, 32.

In a reading operation, the potentials of bit lines BL, /BL are equalized to an H level, and then word line WL is driven to an H level of the selected level. If, for example, memory nodes N1, N2 store an H level and an L level, respectively, a current flows from bit line /BL through transistors 36, 34 to the line of ground potential GND, so that the potential of bit line /BL decreases. Thus, by comparing the potentials of bit lines BL and /BL, data of memory cell MC can be read out.

Returning to FIG. 3, redundant memory array 11 has a configuration similar to that of memory array 10, except that it has a smaller number of columns. Specifically, redundant memory array 11 includes a plurality of memory cells (spare memory cells) MC arranged in rows and columns (herein, only those in two rows and two columns are shown for simplification of the drawing and description), word lines WL provided corresponding to respective rows, and bit line pairs BL, /BL provided corresponding to respective columns. Word lines WL are commonly provided for memory array 10 and redundant memory array 11.

Bit line peripheral circuit 12 includes: N channel MOS transistors (bit line loads) 20 provided corresponding to respective bit lines BL, /BL; and P channel MOS transistors (equalizers) 21 provided corresponding to respective bit line pairs BL, /BL. N channel MOS transistor 20 is connected between a line of power supply potential VCC and one end of corresponding bit line BL or /BL, and has its gate connected to the line of power supply potential VCC. Therefore, each of bit lines BL, /BL is charged to an H level via N channel MOS transistor 20. P channel MOS transistor 21 is connected between corresponding bit lines BL, /BL, and has its gate receiving a bit line equalization signal /BLEQ from row decoder 15. When signal /BLEQ attains an L level of the activated level, P channel MOS transistor 21 is rendered conductive and the potentials of bit lines BL and /BL are equalized.

Read/write circuit 13 includes: N channel MOS transistors 22 provided corresponding to respective bit lines BL of memory array 10; N channel MOS transistors 23 provided corresponding to respective bit lines /BL of memory array 10; a data input/output line pair IO1, /IO1, a sense amplifier 24, and a write driver 25. N channel MOS transistor 22 is connected between the other end of corresponding bit line BL and data input/output line IO1. N channel MOS transistor 23 is connected between the other end of corresponding bit line /BL and data input/output line /IO1. N channel MOS transistors 22, 23 in the first column have their gates connected to column decoder 16 via a column select line CSL1. N channel MOS transistors 22, 23 in the second column have their gates connected to column decoder 16 via a column select line CSL2.

Sense amplifier 24, in a reading operation, compares the potentials of data input/output lines IO1 and /IO1, and applies a data signal at a logic level corresponding to the comparison result to data input/output terminal DQ1. Write driver 25, in a writing operation, drives one of data input/output lines IO1, /IO1 to an H level and the other to an L level according to the logic level of the data signal supplied to data input/output terminal DQ1.

Read/write circuit 14 includes: N channel MOS transistors 26 provided corresponding to respective bit lines BL of redundant memory array 11; N channel MOS transistors 27 provided corresponding to respective bit lines /BL of redundant memory array 11; a data input/output line pair IO2, /IO2; a sense amplifier 28; and a write driver 29. N channel MOS transistor 26 is connected between the other end of corresponding bit line BL and data input/output line IO2. N channel MOS transistor 27 is connected between the other end of corresponding bit line /BL and data input/output line /IO2. The gates of N channel MOS transistors 26, 27 in the first column are connected to redundant column decoder 17 via a spare column select line SCSL1. The gates of N channel MOS transistors 26, 27 in the second column are connected to redundant column decoder 17 via a spare column select line SCSL2.

Sense amplifier 28, in a reading operation, compares the potentials of data input/output line pair IO2 and /IO2, and applies to a spare data input/output terminal SDQ1 a data signal at a logic level corresponding to the comparison result. Write driver 29, in a writing operation, drives one of data input/output lines IO2, /IO2 to an H level and the other to an L level according to the logic level of the data signal supplied to spare data input/output terminal SDQ1.

Row decoder 15, in response to row address signals RA0–RAn, sets bit line equalization signal /BLEQ to an H level corresponding to an inactivated level to stop equalization, and then selects one of the plurality of word lines WL and drives it to an H level of the selected level.

Column decoder 16 is activated in response to signal H1$b$ attaining an H level of the activated level, and selects one of the plurality of column select lines CSL1, CSL2 according to column address signals CA0–CAn, and drives the selected line to an H level of the selected level.

Redundant column decoder 17 includes program circuits provided corresponding to respective spare column select lines SCSL1, SCSL2. Each program circuit is provided with a plurality of fuses for programming column address signals CA0–CAn to designate a defective column. Redundant column decoder 17 is activated in response to signal H1$a$ attaining an H level of the activated level. Redundant column decoder 17 responds to an input of pre-programmed column address signals CA0–CAn, and drives a spare column select line corresponding to the program circuit in which the column address signals have been programmed to an H level of the selected level.

Hereinafter, the operation of tag memory 1 shown in FIGS. 1 to 4 will be described. In a writing operation, bit line equalization signal /BLEQ is set to an H level of the inactivated level to stop equalization, and then word line WL designated by row decoder 15 with row address signals RA0–RAn is driven to an H level of the selected level. In response, the plurality of memory cells MC connected to the word line WL are activated.

When signal $\phi$H1$b$ is at an H level of the activated level, column select line CSL designated by column decoder 16 with column address signals CA0–CAn is driven to an H level of the selected level. N channel MOS transistors 22, 23 connected to the column select line CSL are rendered conductive. The activated memory cells MC are connected to write driver 25 via bit line pair BL, /BL and data input/output line pair IO1, /IO1. Write driver 25 drives one of data input/output lines IO1, /IO1 to an H level and the other to an L level, according to the data signal supplied to data input/output terminal DQ1, so that data are written into memory cells MC.

When signal $\phi$H1$a$ is at an H level of the activated level, spare column select line SCSL designated by redundant column decoder 17 with column address signals CA0–CAn is driven to an H level of the selected level. In response, N channel MOS transistors 26, 27 connected to the spare column select line SCSL are rendered conductive, and the activated memory cells MC are connected to write driver 29 via bit line pair BL, /BL and data input/output line pair IO2, /IO2. Write driver 29 drives one of data input/output lines IO2, /IO2 to an H level and the other to an L level, according to the data signal supplied to spare data input/output terminal SDQ1, to write data into memory cells MC. The data are stored in memory cells MC when word line WL, column select line CSL and spare column select line SCSL are driven to an L level of the non-selected level.

In a reading operation, if signal $\phi$H1$b$ is at an H level of the activated level, column select line CSL designated by column decoder 16 with column address signals CA0–CAn is driven to an H level of the selected level, N channel MOS transistors 22, 23 connected to the column select line CSL are rendered conductive, and bit line pair BL, /BL corresponding to the column select line CSL is connected to sense amplifier 24 via data input/output line pair IO1, /IO1. Bit line equalization signal /BLEQ is set to an H level of the inactivated level to stop equalization of bit lines BL, /BL, and then word line WL designated by row decoder 15 with row address signals RA0–RAn is driven to an H level of the selected level, so that memory cells MC connected to the word line WL are activated. Thus, a current flows into each memory cell MC from either one of bit lines BL, /BL according to the data stored in the memory cell MC, and in response, the potential of one of data input/output lines IO1, /IO1 drops. Sense amplifier 24 compares the potentials of data input/output lines IO1 and /IO1, and outputs a data signal at a logic level corresponding to the comparison result to data input/output terminal DQ1.

If signal φH1$a$ is at an H level of the activated level, spare column select line SCSL designated by redundant column decoder 17 with column address signals CA0–CAn is driven to an H level of the selected level, and N channel MOS transistors 26, 27 connected to the spare column select line SCSL are rendered conductive. Bit line pair BL, /BL corresponding to the spare column select line SCSL is connected to sense amplifier 28 via data input/output line pair IO2, /IO2. Bit line equalization signal /BLEQ is driven to an H level of the inactivated level to stop equalization of bit lines BL, /BL, and then word line WL designated by row decoder 15 with row address signals RA0–RAn is pulled up to an H level of the selected level, and memory cells MC connected to the word line WL are activated. Thus, a current flows into each memory cell MC from one of bit lines BL, /BL according to the data stored in the memory cell MC, and in response, the potential of one of data input/output lines IO2, /IO2 drops. Sense amplifier 28 compares the potentials of data input/output lines IO2 and IO2, and outputs a data signal at a logic level corresponding to the comparison result to spare data input/output terminal SDQ1.

Returning to FIG. 1, data memory 2 is a memory for writing/reading of data of a plurality of bits (herein, represented by two bits for simplification of the drawing and description). If necessary, it also performs writing/reading of data that should be performed by tag memory 1.

Figure 5A:
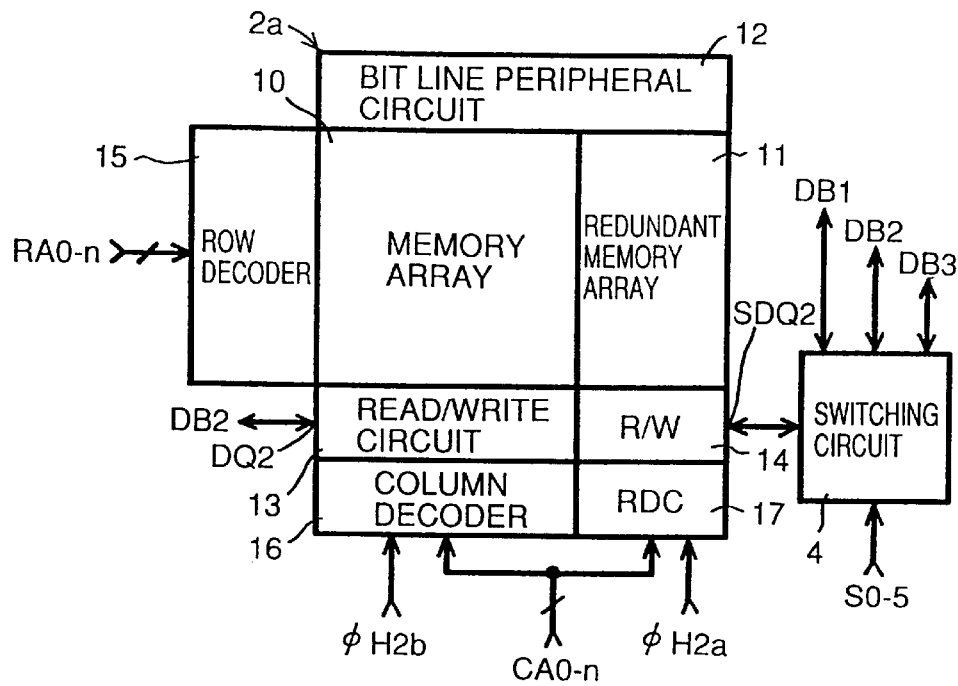
FIGS. 5A and 5B are block diagrams showing configurations of an SRAM included in a data memory shown in FIG. 1.
Figure 5B:
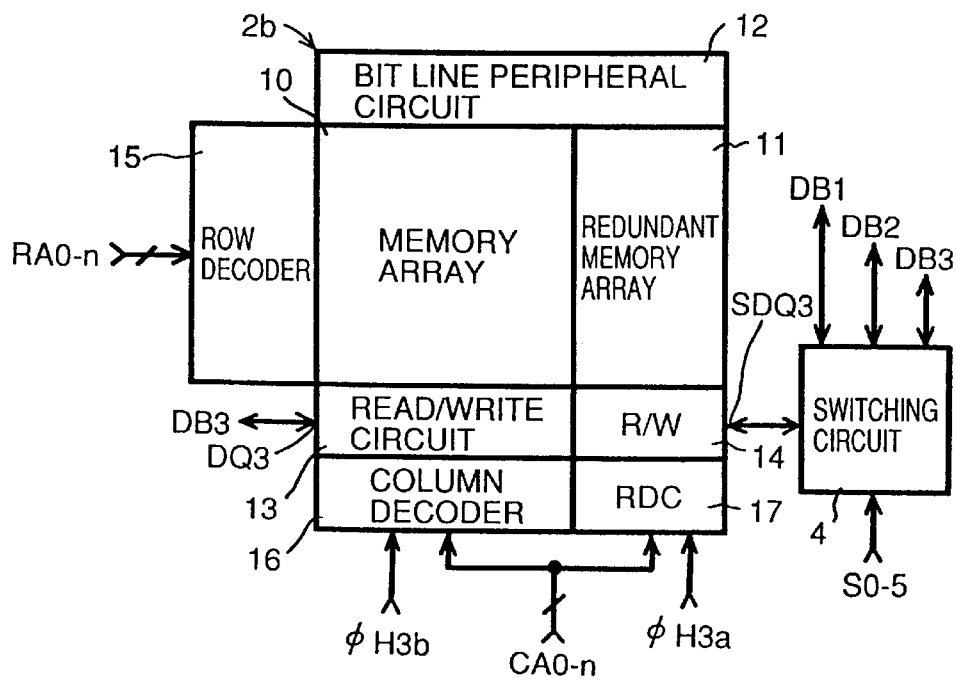

Data memory 2 includes two SRAMs 2*a* and 2*b* shown in FIGS. 5A and 5B, respectively. SRAM 2*a* is similar to SRAM 1*a* shown in FIG. 2, except that signals φH1$a$, φH1$b$ are replaced by signals φH2$a$, φH2$b$, and data input/output terminal DQ1 and spare data input/output terminal SDQ1 are replaced by data input/output terminal DQ2 and spare data input/output terminal SDQ2, respectively. Likewise, SRAM 2*b* is similar to SRAM 1*a* shown in FIG. 2, except that signals φH1$a$, φH1$b$ are replaced by signals φH3$a$, φH3, and data input/output terminal DQ1 and spare data input/output terminal SDQ1 are replaced by data input/output terminal DQ3 and spare data input/output terminal SDQ3, respectively.

Specifically, data memory 2 is controlled by signals φH2$a$, φH2$b$, φH3$a$ and φH3$b$ from control circuit 5, and performs reading/writing of data at an address designated by row address signals RA0–RAn and column address signals CA0–CAn. When signals φH2$b$, φH3$b$, φH2$a$, and φH3$a$ are at an H level of the activated level, input/output of data to/from data memory 2 is performed via data input/output terminals DQ2, DQ3, spare data input/output terminals SDQ2, and SDQ3, respectively. Data input/output terminals DQ2, DQ3 are connected to logic circuit 3 and switching circuit 4 via data buses DB2, DB3, respectively. Spare data input/output terminals SDQ2, SDQ3 are connected to switching circuit 4.

Logic circuit 3, in a writing operation, applies tag data ATD to memories 1, 2 via data bus DB1 or switching circuit 4, and applies data DATA to memories 2, 1 via data buses DB2, DB3 or switching circuit 4. In a reading operation, logic circuit 3 externally outputs data DATA provided from memories 2, 1 via data buses DB2, DB3 or switching circuit 4. It also compares tag data provided from memories 1, 2 via data bus DB1 or switching circuit 4 with externally supplied tag data ATD, and, if the two tag data match, outputs a signal HIT indicating that read data DATA is valid, and, if the two data mismatch, outputs a signal MISS indicating that read data DATA is invalid.

Figure 6A:
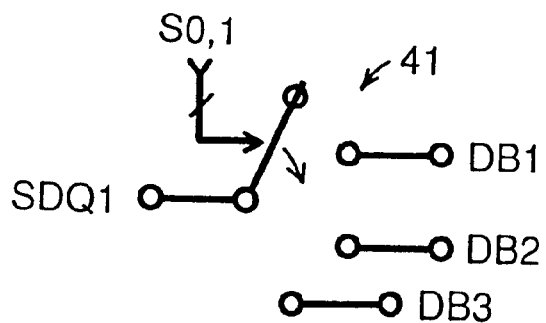
FIGS. 6A to 6C are circuit diagrams showing configurations of a switching circuit shown in FIG. 1.
Figure 6B:
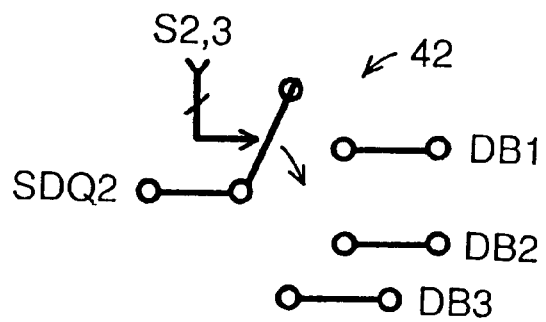
Figure 6C:
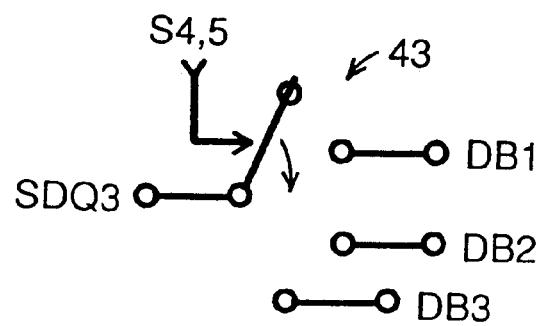

Switching circuit 4 couples spare input/output terminals SDQ1–SDQ3 and data buses DB1–DB3 in a desired combination according to select signals S0–S5 from control circuit 5. Switching circuit 4 includes three switches 41–43, as shown in FIGS. 6A to 6C. Switches 41–43 connects spare data input/output terminals SDQ1–SDQ3 with any or none of data buses DB1–DB3, according to signals S0, S1; S2, S3; S4, S5, respectively.

Control circuit 5 includes a plurality of program circuits each having a plurality of fuses for programming levels of column address signals CA0–CAn designating a defective column and of signals S0–S5, φH1$a$, φH1$b$, φH2$a$, φH2$b$, φH3$a$ and φH3$b$ to be output when the column address signals CA0–CAn are input. Control circuit 5 outputs these signals S0–S5, φH1$a$, φH1$b$, φH2$a$, φH2$b$, φH3$a$ and φH3$b$ according to column address signals CA0–CAn to control memories 1, 2 and switching circuit 4.

Hereinafter, the operation of the cache memory shown in FIGS. 1 to 6C will be described. When a column designated by column address signals CA0–CAn input is normal, no spare column will be used. In this case, column decoders 16 in memories 1, 2 are activated and redundant column decoders 17 are not activated, so that spare data input/output terminals SDQ1–SDQ3 are separated from data buses DB1–DB3.

Data DATA at an address designated by address signals RA0–RAn, CA0–CAn is read out from memory arrays 10, 10 of data memory 2, and externally output via data input/output terminals DQ2, DQ3, data buses DB2, DB3 and logic circuit 3.

Tag data at the address designated by address signals RA0–RAn, CA0–CAn is read out from memory array 10 of tag memory 1, and supplied to logic circuit 3 via data input/output terminal DQ1 and data bus DB1. Logic circuit 3 compares the tag data provided via data bus DB1 with tag data ATD externally supplied, and outputs signal HIT or MISS according to the comparison result.

On the contrary, if the column designated by column address signals CA0–CAn input is defective, and if a defective column of memory array 10 in each of SRAMs 1*a*, 2*a* and 2*b* has been programmed such that it is replaced by a spare column of redundant memory array 11, then redundant column decoders 17 in memories 1, 2 are activated and column decoders 16 are inactivated. Spare data input/output terminals SDQ1–SDQ3 are connected via switching circuit 4 to data buses DB1–DB3, respectively.

Data DATA at an address designated by address signals RA0–RAn, CA0–CAn is read out from redundant memory arrays 11, 11 of data memory 2, and externally output via spare data input/output terminals SDQ2, SDQ3, switching circuit 4, data buses DB2, DB3 and logic circuit 3. Tag data at the address designated by address signals RA0–RAn, CA0–CAn is read out from redundant memory array 11 of tag memory 1, and supplied to logic circuit 3 via spare data input/output terminal SDQ1, switching circuit 4 and data bus DB1. Logic circuit 3 compares the tag data provided via data bus DB1 with externally supplied tag data ATD, and outputs signal HIT or MISS based on the comparison result.

If the column designated by column address signals CA0–CAn input is defective and if a defective column of memory array 10 in tag memory 1 is programmed to be replaced by a spare column of redundant memory array 11 in SRAM 2a, then column decoder 16 and redundant column decoder 17 of SRAM 2a and also column decoder 16 of SRAM 2b are activated, while column decoder 16 and redundant column decoder 17 of tag memory 1 and redundant column decoder 17 of SRAM 2b are not activated. Spare data input/output terminal SDQ2 is connected via switching circuit 4 to data bus DB1.

Data DATA at an address designated by address signals RA0–RAn, CA0–CAn is read out from memory arrays 10, 10 of data memory 2, and externally output via data input/output terminals DQ2, DQ3, data buses DB2, DB3 and logic circuit 3. Tag data at the address designated by address signals RA0–RAn, CA0–CAn is read out from redundant memory array 11 of data memory 2, and supplied to logic circuit 3 via spare data input/output terminal SDQ2, switching circuit 4 and data bus DB1. Logic circuit 3 compares the tag data provided via data bus DB1 with externally supplied tag data ATD, and outputs signal HIT or MISS according to the comparison result.

If the column designated by column address signals CA0–CAn input is defective, and if a defective column of memory array 10 in SRAM 2b is programmed to be replaced by a spare column of redundant memory array 11 in tag memory 1, then column decoder 16 and redundant column decoder 17 of tag memory 1 and column decoder 16 of SRAM 2a are activated, while column decoder 16 and redundant column decoder 17 of SRAM 2b and redundant column decoder 17 of SRAM 2a are not activated. Spare data input/output terminal SDQ1 is connected via switching circuit 4 to data bus DB3.

Data DATA at an address designated by address signals RA0–RAn, CA0–CAn is read out from memory array 10 of SRAM 2a and redundant memory array 11 of tag memory 1, and externally output via data input/output terminals DQ2, DQ3, data buses DB2, DB3 and logic circuit 3. Tag data at the address designated by address signals RA0–RAn, CA0–CAn is read out from memory array 10 of tag memory 1, and supplied to logic circuit 3 via data input/output terminal DQ1 and data bus DB1. Logic circuit 3 compares the tag data provided via data bus DB1 with externally supplied tag data ATD, and outputs signal HIT or MISS based on the comparison result.

Hereinafter, a testing method of the cache memory shown in FIGS. 1 to 6C will be described with reference to FIG. 7.

Figure 7:
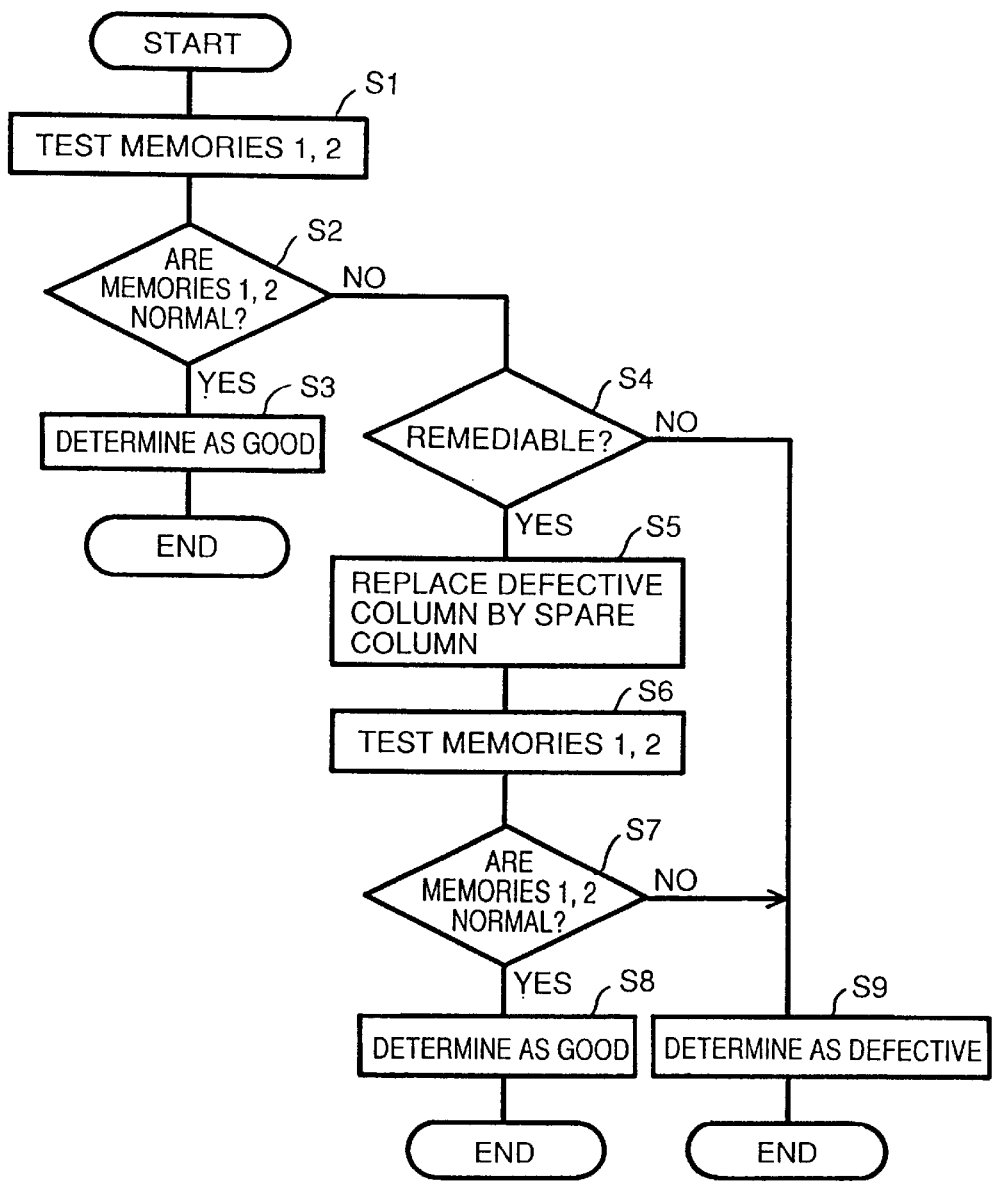
FIG. 7 is a flow chart illustrating a testing method of the cache memory shown in FIGS. 1 to 6C.

Referring to FIG. 7, memories 1, 2 are tested in step S1. In step S2, a decision is made whether memories 1, 2 are normal. If so, the cache memory is determined as "good" in step S3. If either or both memories 1, 2 are decided as abnormal in step S2, a decision is made whether they are remediable in step S4. If "YES" in step S4, defective column(s) in either or both memories 1, 2 are replaced by spare column(s) in step S5.

Thereafter, in step S6, memories 1, 2 are tested again. In step S7, a decision is made if memories 1, 2 are normal. If so, the cache memory is determined as "good" in step S8. If it is decided that either or both memories 1, 2 are remediless in step S4, or if it is decided that either or both memories 1, 2 are abnormal in step S7, the cache memory is determined as "defective" in step S9.

As explained above, the present embodiment enables replacement of a defective column in tag memory 1 by a spare column in data memory 2 and replacement of a defective column in data memory 2 by a spare column in tag memory 1. As a consequence, compared to the conventional case where a defective column in a memory was only replaceable by a spare column in the same memory, the degree of freedom in redundancy as well as the yield increase.

Figure 9:
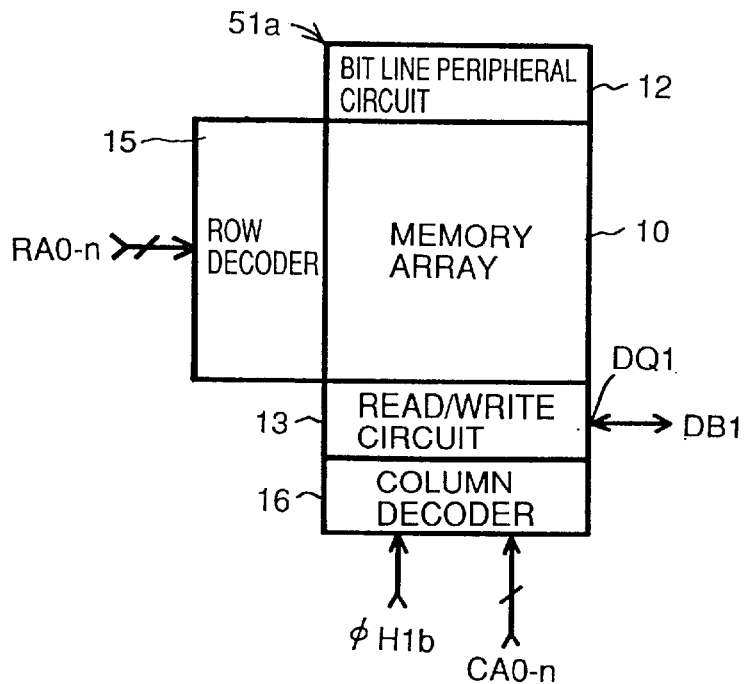
FIG. 9 is a block diagram showing a configuration of an SRAM included in a tag memory shown in FIG. 8.
Figure 10:
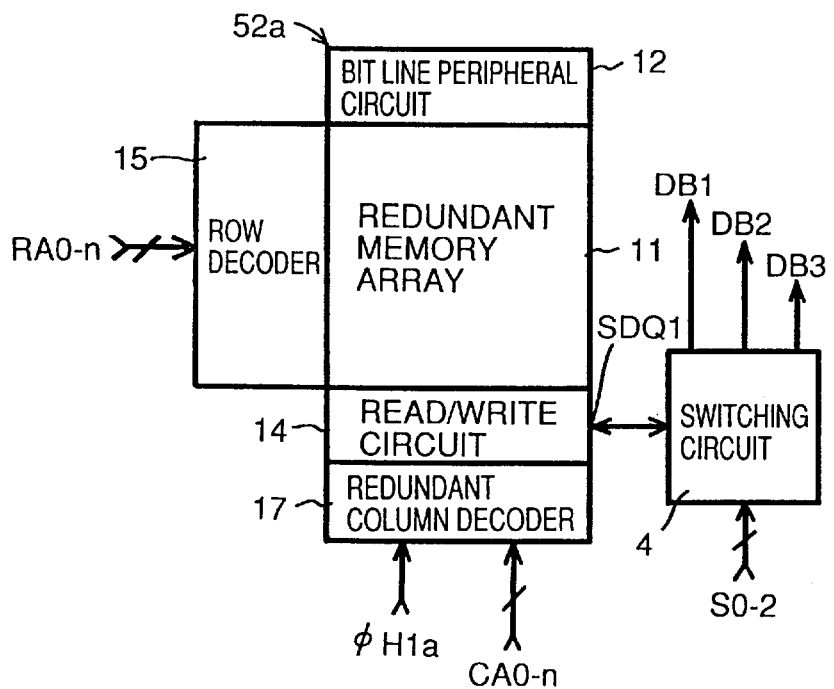
FIG. 10 is a block diagram showing a configuration of an SRAM included in a data memory shown in FIG. 8.

Modifications of the embodiment will now be described. In a modification shown in FIG. 8, SRAM 1a in FIG. 2 is divided into a portion 51a associated with memory array 10 and a portion 52a associated with redundant memory array 11, as shown in FIGS. 9 and 10. A tag memory 51 is formed with the portion 51a associated with memory array 10. A data memory 52 is formed with the portion 52a associated with redundant memory array 11 and SRAMs 2a, 2b. According to this modification, tag memory 51 has no redundant memory portion. Thus, a layout size of tag memory 51 can be made smaller than otherwise, and therefore, flexibility in chip layout increases. In addition, it is unnecessary to lay out the redundant memory for tag memory 51 and data memory 52, respectively. This reduces the time required for the development. Although the redundant memory portion is collectively placed on the data memory 52 side in this modification, it is of course possible to place the portion on the tag memory 51 side.

Figure 8:
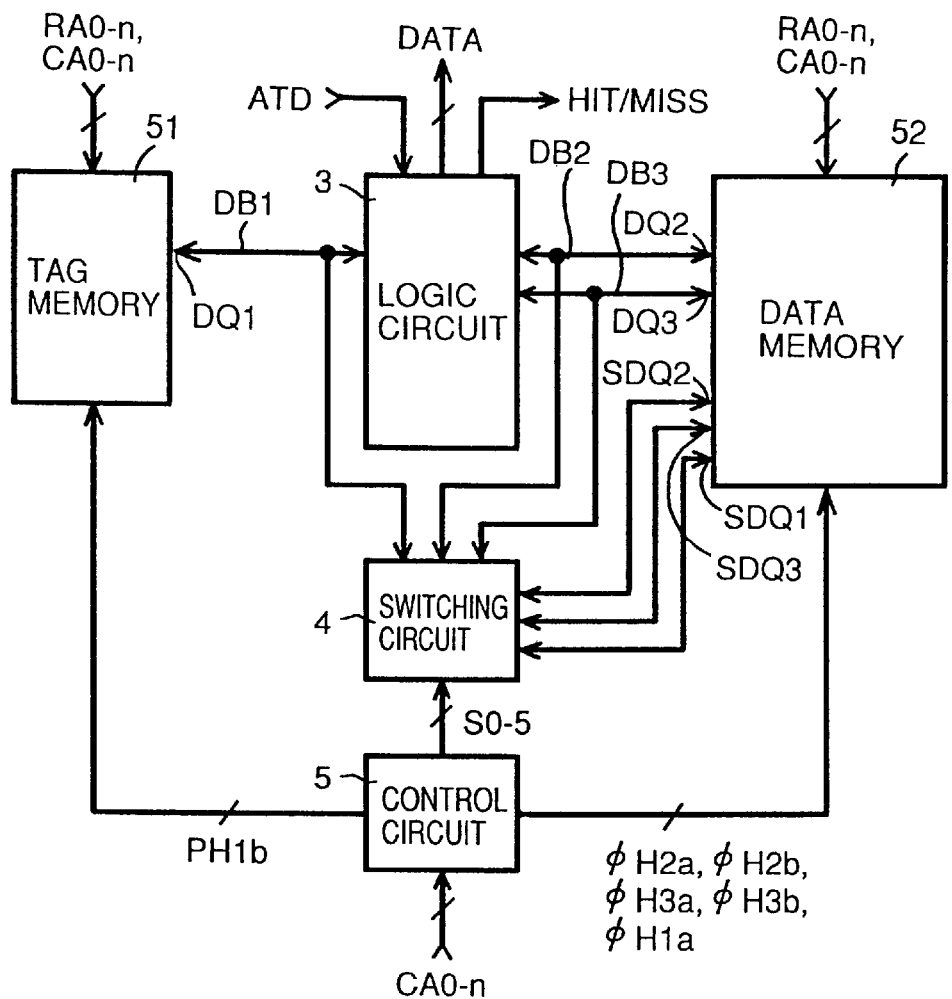
FIG. 8 is a block diagram showing a modification of the embodiment.
Figure 11:
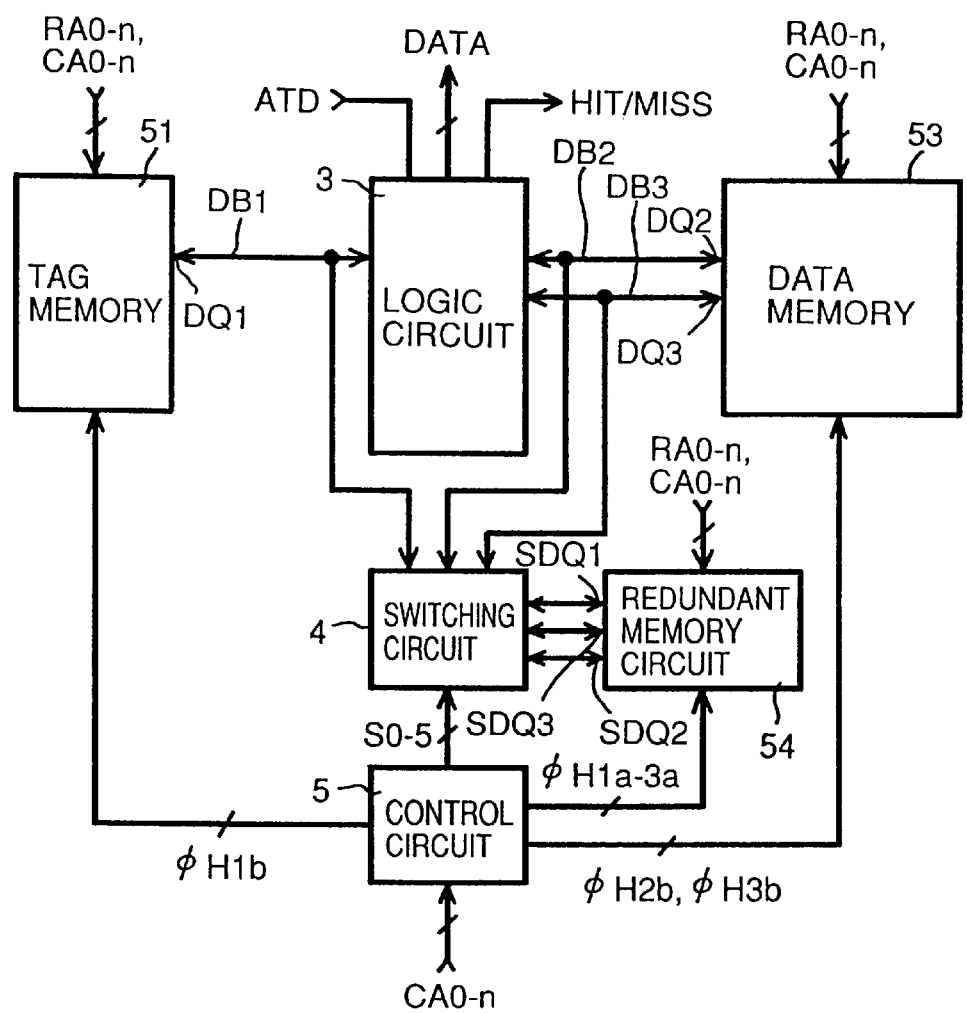
FIG. 11 is a block diagram showing another modification of the embodiment.
Figure 12:
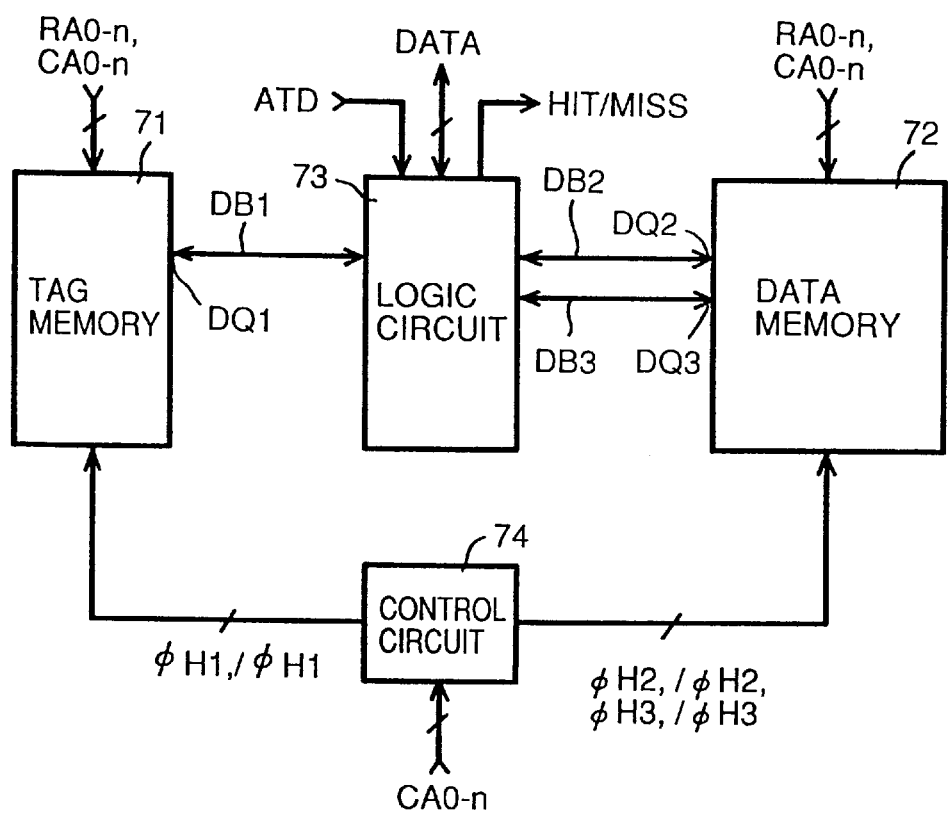
FIG. 12 is a block diagram showing a configuration of a conventional cache memory.
Figure 13:
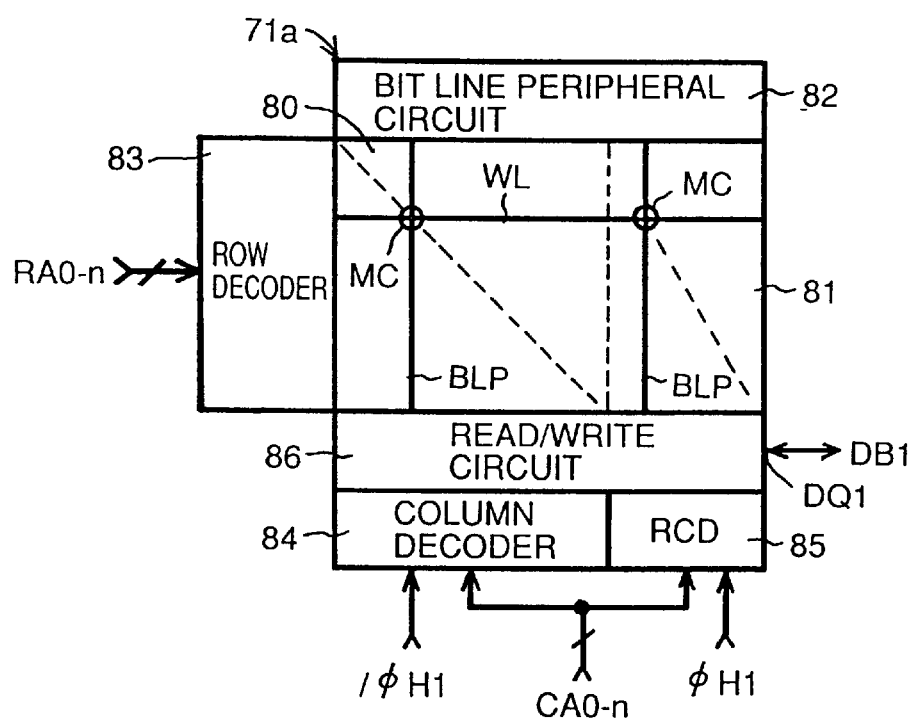
FIG. 13 is a block diagram showing a configuration of an SRAM included in a tag memory shown in FIG. 12.

In another modification shown in FIG. 11, data memory 52 shown in FIG. 8 is divided into a portion associated with memory array 10 and a portion associated with redundant memory array 11. A data memory 53 is formed with the portion associated with memory array 10, and a redundant memory circuit 54 is formed with the portion associated with redundant memory array 11. In this case, the redundant memory portion can be laid out independently, which increases flexibility in layout. Further, redundant memory circuit 54 can be collectively placed in a spare region on the chip, so that effective area use is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of reading/writing data in a unit of N bits (N is an integer at least 2), comprising:

first to Nth memory arrays having a plurality of memory cells, respectively, each of the memory cells having a specific address signal assigned thereto;

first to Nth read/write circuits provided corresponding to the first to Nth memory arrays, respectively, each selecting one of the plurality of memory cells included in corresponding said memory array according to an external address signal to perform reading/writing of data of the memory cell;

first to Nth data input/output terminals coupled to said first to Nth read/write circuits, respectively, each performing output of read data and input of write data;

a spare memory cell for replacement with a defective memory cell;

an Nth plus one read/write circuit storing an address signal of the defective memory cell and performing reading/writing of data of said spare memory cell in response to matching of the external address signal and the stored address signal;

a control circuit storing the address signal of the defective memory cell and a number i (i is an integer from 1 to N) of the memory array to which the memory cell belongs, and inactivating the ith read/write circuit in response to matching of the external address signal and the stored address signal; and a switching circuit coupling said Nth plus one read/write circuit with the ith data input/output terminal in response to the inactivation of said ith read/write circuit by said control circuit.

2. The semiconductor memory device according to claim 1, wherein a plurality of sets of said spare memory cell, said Nth plus one read/write circuit, said control circuit and said switching circuit are provided, and a plurality of sets of said spare memory cell and said Nth plus one read/write circuit are distributed in the vicinity of said first to Nth memory arrays.

3. The semiconductor memory device according to claim 1, wherein a plurality of sets of said spare memory cell, said Nth plus one read/write circuit, said control circuit and said switching circuit are provided, and a plurality of sets of said spare memory cell and said Nth plus one read/write circuit are collectively placed in a predetermined region.

4. The semiconductor memory device according to claim 1, wherein said semiconductor memory device is a cache memory, the first to Mth (M is an integer at least 1 and at most N−1) memory arrays constitute a tag memory for performing reading/writing of tag data, the Mth plus one to the Nth memory arrays constitute a data memory for performing reading/writing of data, and said cache memory further includes a logic circuit, responsive to matching of the tag data output from the first to Mth data input/output terminals and external tag data, for outputting an signal indicating that the data output from the Mth plus one to the Nth data input/output terminals is valid.

* * * * *